United States Patent
Dress

(10) Patent No.: US 10,153,925 B2
(45) Date of Patent: Dec. 11, 2018

(54) TIME DOMAIN SYMBOLS ENCODER AND DECODER

(71) Applicant: LightFleet Corporation, Camas, WA (US)

(72) Inventor: William B. Dress, Camas, WA (US)

(73) Assignee: Lightfleet Corporation, Camas, WA (US)

( * ) Notice: Subject to any disclaimer, the term of this patent is extended or adjusted under 35 U.S.C. 154(b) by 44 days.

(21) Appl. No.: 14/499,167

(22) Filed: Sep. 27, 2014

(65) Prior Publication Data

US 2015/0029832 A1  Jan. 29, 2015

Related U.S. Application Data

(63) Continuation of application No. 12/074,551, filed on Mar. 3, 2008, now Pat. No. 8,848,808.

(60) Provisional application No. 60/904,689, filed on Mar. 1, 2007.

(51) Int. Cl.
   *H04L 27/00* (2006.01)
   *H04L 25/49* (2006.01)
   *H03K 7/08* (2006.01)
   *H03K 9/08* (2006.01)

(52) U.S. Cl.
   CPC ........... *H04L 25/4902* (2013.01); *H03K 7/08* (2013.01); *H03K 9/08* (2013.01)

(58) Field of Classification Search
   CPC ............. H04L 27/2627; H04L 25/4902; H04L 63/101; H04B 10/116; H03F 1/0233; H03F 3/19

USPC ........ 375/259, 235, 261, 316, 350; 342/316, 342/367, 378

See application file for complete search history.

(56) References Cited

U.S. PATENT DOCUMENTS

| | | | |
|---|---|---|---|
| 4,211,834 A | 7/1980 | Lapadula et al. | |
| 4,230,902 A | 10/1980 | Hug et al. | |
| 4,388,720 A | 6/1983 | Silfvast et al. | |
| 4,600,299 A | 7/1986 | Abshire | |
| 5,227,906 A | 7/1993 | Tokumitsu | |
| 5,274,673 A * | 12/1993 | Kaharu | H04L 25/4904 375/282 |
| 5,532,856 A | 1/1996 | Li et al. | |

(Continued)

FOREIGN PATENT DOCUMENTS

GB  2404054  1/2005
WO  WO 2005/038479  4/2005

OTHER PUBLICATIONS

International Search Report from PCT/US2008/002835 dated Oct. 20, 2008.

(Continued)

*Primary Examiner* — Khai Tran
(74) *Attorney, Agent, or Firm* — John Bruckner PC

(57) ABSTRACT

A multidimensional symbol encoder is coupled to a transmitter. Multidimensional symbols are encoded by concatenating two or more partial symbols, wherein individual intervals of up and down sections of the two or more partial symbols are independently controlled as to duration. A multidimensional symbol decoder is coupled to a receiver. Multidimensional symbols are decoded by measuring duration of individual intervals i) that are independently controlled as to duration and ii) that are up and down sections of two or more concatenated partial symbols.

2 Claims, 2 Drawing Sheets

Symbol generator block diagram

(56) References Cited

U.S. PATENT DOCUMENTS

| | | | |
|---|---|---|---|
| 5,493,282 A * | 2/1996 | Petreye | G08B 3/1066 |
| | | | 340/4.51 |
| 5,541,914 A | 7/1996 | Krishnamoothy et al. | |
| 5,576,873 A | 11/1996 | Crossland et al. | |
| 6,027,941 A | 2/2000 | Jarvie et al. | |
| 6,326,600 B1 | 12/2001 | Christensen et al. | |
| 6,414,774 B1 | 7/2002 | Scifres | |
| 6,683,418 B2 | 1/2004 | Shoji et al. | |
| 6,715,124 B1 * | 3/2004 | Betts | H04L 1/006 |
| | | | 375/265 |
| 7,286,719 B2 | 10/2007 | Riley et al. | |
| 7,450,857 B2 | 11/2008 | Dress et al. | |
| 7,526,053 B1 | 4/2009 | Sallaway et al. | |
| 7,667,830 B2 | 2/2010 | Harres | |
| 2002/0001127 A1 | 1/2002 | Morishima | |
| 2002/0112139 A1 | 8/2002 | Krause et al. | |
| 2003/0210409 A1 | 11/2003 | Huang et al. | |
| 2004/0114450 A1 | 6/2004 | Kang et al. | |
| 2004/0128610 A1 * | 7/2004 | Wei | H03M 13/41 |
| | | | 714/792 |
| 2004/0161052 A1 | 8/2004 | Santhoff et al. | |
| 2005/0123061 A1 | 6/2005 | Smith et al. | |
| 2005/0138438 A1 | 6/2005 | Bodes et al. | |
| 2005/0228282 A1 | 10/2005 | Wang et al. | |
| 2006/0045197 A1 | 3/2006 | Ungerboeck et al. | |
| 2006/0203900 A1 * | 9/2006 | Koralek | H04L 25/03267 |
| | | | 375/233 |
| 2007/0067003 A1 | 3/2007 | Sanchez et al. | |
| 2009/0279331 A1 | 11/2009 | Young et al. | |

OTHER PUBLICATIONS

International Search Report from PCT/US2003/035242 dated May 13, 2004.

Cloonan, et al, "Shuffle-Equivalent Interconnection Topologies Based on Computer-Generated Binary-Phase Gratings", Applied Optics, Optical Society of America, Washington, vol. 33, No. 8, Mar. 10, 1994, p. 1405-1430.

McCormick, et al., "Five-Stage Free-Space Optical Switching Network With Field-Effect Transistor Self-Electro-Optic-Effect-Device Smart-Pixel Arrays", Applied Optics, Optical Society of America, Washington, vol. 33, No. 8, Mar. 10, 1994, p. 1601-1618.

* cited by examiner 4D symbol

Symbol generator block diagram

Symbol decoder block diagram

TIME DOMAIN SYMBOLS ENCODER AND DECODER

CROSS-REFERENCES TO RELATED APPLICATIONS

This application is a continuation of, and claims a benefit of priority under 35 U.S.C. 120 from utility patent application U.S. Ser. No. 12/074,551, filed Monday, Mar. 3, 2008, (now U.S. Pat. No. 8,848,808) which in-turn is a utility of, and claims a benefit of priority under 35 U.S.C. 119(e) from provisional patent application U.S. Ser. No. 60/904,689, filed Mar. 1, 2007, the entire contents of which are hereby expressly incorporated herein by reference for all purposes.

BACKGROUND INFORMATION

Field of the Invention

The field of the invention is broadly the modulation of certain carrier media for the purpose of transmitting information between two spatially separated points. More particularly, the invention addresses a particular method and use of pulse-width modulation (PWM) for the encoding of digital data into certain physical signals prior to transmission and the decoding of such signals back into a representation of the same digital data.

Discussion of the Related Art

Prior art in modulation and demodulation teaches various methods of pulse-width, amplitude, frequency, phase, polarization, and acousto-optic modulation. To achieve higher spectral efficiency, these methods are often combined to produce a physical symbol having multiply definable and measurable physical characteristics. A symbol with multiple independently controllable features may be termed multidimensional, with each physical parameter representing a distinct dimension.

A problem with conventional approaches is the requirement for multiple circuits operating in parallel to achieve distinct and separate modulation of each of the several physical attributes. This complicates both the transmitter and receiver process and hardware in that the diverse physical attributes being modulated or demodulated require distinct and separate means that must be managed simultaneously.

SUMMARY OF THE INVENTION

There is a need for the following embodiments of the invention. Of course, the invention is not limited to these embodiments.

According to an embodiment of the invention, a process comprises: creating a bipolar pulse whose high (up) and low (down) periods are separately and precisely controllable. According to another embodiment of the invention, a method, comprises creating multidimensional symbols by conjoining one or more bipolar pulses. According to another embodiment of the invention, a method, comprises encoding symbols and transmitting a signal, wherein a single bipolar pulse with independently variable up and down periods represents a two-dimensional symbol. According to another embodiment of the invention, an apparatus comprises a symbol encoder. According to another embodiment of the invention, an apparatus, comprises a symbol detector.

These, and other, embodiments of the invention will be better appreciated and understood when considered in conjunction with the following description and the accompanying drawings. It should be understood, however, that the following description, while indicating various embodiments of the invention and numerous specific details thereof, is given for the purpose of illustration and does not imply limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer concept of embodiments of the invention, and of components combinable with embodiments of the invention, and operation of systems provided with embodiments of the invention, will be readily apparent by referring to the exemplary, and therefore nonlimiting, embodiments illustrated in the drawings (wherein identical reference numerals (if they occur in more than one view) designate the same elements). Embodiments of the invention may be better understood by reference to one or more of these drawings in combination with the following description presented herein. It should be noted that the features illustrated in the drawings are not necessarily drawn to scale.

DESCRIPTION OF PREFERRED EMBODIMENTS

Figure 1:
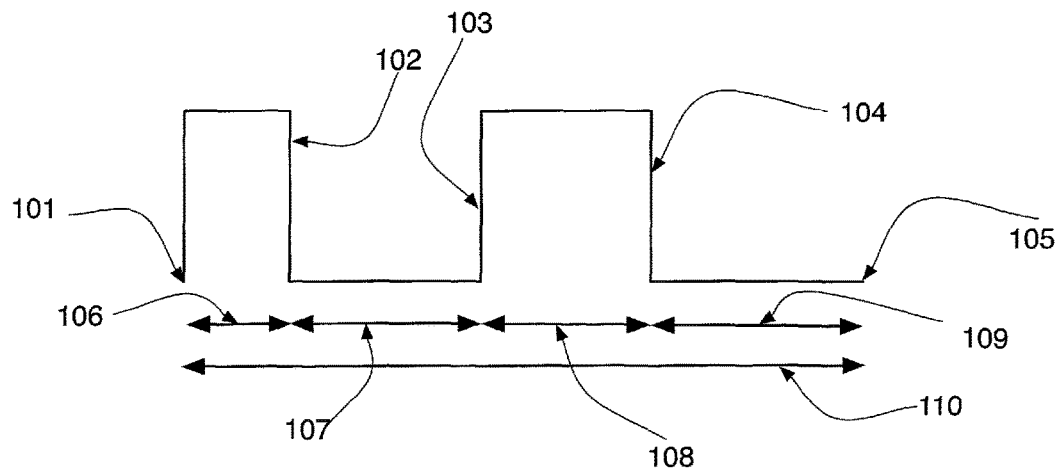
FIG. 1 shows a four-dimensional, PWM signal, representing an example of a type of signal representing an embodiment of the invention.

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

The below-referenced U.S. Patent(s) and U.S. Patent Application(s) disclose embodiments that are useful for the purposes for which they are intended. The entire contents of U.S. Pat. No. 7,136,419 [Ref 1] "Pulse width communications using precision timing", United States Patent Application US 20050123061 [Ref 2] "Multidimensional signal modulation and/or demodulation for data communications", U.S. Pat. No. 6,445,326 [Ref 3] "High speed precision analog to digital converter", and U.S. Pat. No. 6,850,177 [Ref 4] "Digital to analog converter" are hereby expressly incorporated by reference herein for all purposes.

This work describes a means of conjoining two or more PWM signals wherein each section of each pulse has a separately determined width (a pulse is defined as a signal having a high phase or state followed by a low phase or state). Each logical grouping of n such pulses represents a physical symbol with 2n dimensions since each of the n high states and each of the n low states are independently controlled as to their widths to within some prespecified resolution of the generating circuit. The reference to a dimensionality of the symbol is supported by the fact that each of the 2n parts comprising the symbol may be independently varied.

In this work, a multidimensional symbol is defined by concatenating partial symbols wherein each partial symbol occupies a different time slot and each part is determined by the same physical property, namely duration in the preferred embodiment, which varies for each of the 2n parts. The whole symbol occupies the sum of times for each of the 2n time slots comprising the 2n dimensional signal. Each distinct symbol has a different duration and it is the set or collection of all durations that remains constant for a given implementation, each symbol being chosen from this set.

In the present invention, there is only one physical property whose change in state identifies a part of a symbol (not the entire symbol), namely the duration in time of the state or, equivalently, the time of occurrence of a transition between a high part and a low part. This feature is responsible for the simplicity of the symbol-generation and identification circuitry. The identification of a complete symbol is determined by convention, namely by a count of transitions between the high and low states. This is a subtle but telling distinction between the present invention and those set forth in Ref 1 and Ref 2. The prior art may be thought of as viewing the construction and definition of physical symbols by physical properties alone, where a change in any one of the physical properties listed above determined a symbol boundary. The novelty in the present invention completely removes this restriction and allows a symbol to be defined logically by counting or setting the number of high-low transitions and low-high transitions. The time between these transitions acts as the physical carriers of information in the symbol.

Further, this disclosure teaches a specific means of decoding such logical symbols by measuring the physical durations of each part, wherein a part is defined by a rising or falling pulse edge. The advantage to communications of data in the presence of noise is disclosed in Ref. 2, particularly in the discussion of four-dimensional symbol constellations. The same concept is used in the present invention.

The primary goal of this invention is to provide a method of transmitting information in the form of a stream of bits over a carrier having a bandwidth B at a bit rate that is some multiple of B in a simple and effective manner and detecting or recovering such information at a receiver. A secondary goal of this invention is to effect such transmission and detection as to minimize the error rate in the received bit stream. These two goals are to be accomplished under the constraint of simple and low-cost hardware that makes use of standard practices in digital circuit design and manufacture.

In the following, the term "symbol" generally refers to the logical construct either as an abstraction of n numbers arrange as an n-tuple of integers as $\{i, j, k, l\}$. This term is also used to describe an output voltage or signal level of the generating mechanism as well as a logical portion of the signal being transmitted, received, or decoded. The term "signal" usually refers to a physical voltage level as well as the physical wave or energy (e.g., RF or light) that is carrying the logical symbol as information.

Error Distributions in Timing Measurements

The idea is to compute the error distribution or SNR equivalent for measurements in the time domain. Sources of error are
1. Source power fluctuations
2. Cross talk between various channels
3. Jitter and fluctuations in the symbol generation (time)
4. Jitter and offsets in the receiver measurement (time, again).

In the development below, we will assume that these sources of error and noise, when combined, will produce a jitter in the pulse width (temporal uncertainty in the position of the pulse width or position of its edges) and a jitter in the measuring circuit (temporal uncertainty as to when the circuit identifies an edge transition).

The result of the investigations below establish guidelines for both the transmitter (pulse-generating mechanism) and receiver (pulse-measuring mechanism) and relate the symbol error rate to the jitter in the transmitter and receiver.

Symbols & Indices

The emitted symbols have the form $\{i,j,k,l\} \times$delta where $i+j+k+l$ is even and delta is the time resolution of the generating circuits. There is an offset of CapDelta for each symbol segment where CapDelta is half the reciprocal bandwidth of the system.

The symbol set with only one increment has eight members (including the symbol $\{0,0,0,0\}$). Here, they are arranged in eight columns with each symbol displayed as a vertical column of four numbers. Note the sum of each column is an even number.

Suppose the measurement resolution is epsilon, where epsilon $\varepsilon \leq \delta$delta. Epsilon is chosen to be the smallest resolvable increment in pulse width at the receiver. Typically, both epsilon and delta are much smaller than CapDelta. Example: a 10 GHz bandwidth circuit will have a CapDelta of 50 ns and a delta of perhaps 10 ns with epsilon of perhaps 5 ns. Take a typical symbol based on these numbers, say $\{2,3,0,1\}$ and generate a sequence of high-low-high-low edge times of $50+10\{2,3,0,1\}$ns or $\{70,80,50,60\}$ns which indicates a symbol having 70 ns high, 80 ns low, 50 ns high, and 60 ns low portions. This places edges at times 0 (rising), 70 (falling), 150 (rising), 200 ns (falling), and the rising edge of the next symbol occurs at time 260 ns. This is illustrated below.

Mapping Bit Patterns onto Symbols

The simplest mapping is to index the symbol set and simply assign symbols to their respective index values. This would assign binary 0 to symbol $\{0,0,0,0\}$, binary 1 to symbol $\{0,0,1,1\}$ and so forth. This might be too simple, however. Suppose we want to reserve $\{0,0,0,0\}$ for a synchronize pulse or other special case. Also, the number of symbols in a set with index n is not a power of two, except for $n=2j-1$ for some integer $j>0$. This is not a problem, since we will always be needing special control symbols that do not represent any binary data.

Guidelines for the Pulse-Generating Circuit (Transmitter)

The idea is to use four timing circuits running in parallel. These timers are loaded with the initial set of numbers. If the symbol is $\{i,j,k,l\}$ then the first timer is loaded with i, the second with i+j, the third with i+j+k, and the fourth with i+j+j+l. Once loaded, all four start simultaneously and the output circuit goes high. As each timer times out, it generates a clock which changes the state of the output circuit. Before the last timer fires, a new set of four numbers generated from the next symbol is loaded. Each time has an offset. If the circuit bandwidth is B gigahertz, the offsets are CapDelta for the first, 2× CapDelta for the second, 3× CapDelta for the third and 4× CapDelta for the fourth where CapDelta=½B ns.

Measuring Pulse Widths in the Presence of Jitter

Each symbol has noise that appears as jitter in the rising and falling edges. In addition, the receiver circuitry also has noise jitter which can assign a symbol edge to the wrong number. Below is an illustration of a pulse with Gaussian jitter on the rising and falling edges; the jitter has a standard deviation equal to a tenth of the width of the pulse. Note that amplitude noise appears as temporal jitter when the pulse has realistic sloping sides. This will be explored later.

The ideal edge detector would have a decision point at the center of the expected pulse, shown by the red arrow. Of course, the decision point also has jitter, so a better picture would be that of three Gaussian distributions as shown below.

The actual detection scheme is somewhat different in that a pulse edge, rising or falling, depending on the "polarity" of the circuit, is assigned to an interval represented by an integer. The assignment intervals are passing by, so to speak, and the edge transition, when it occurs, selects the most recent interval. One may think of a clock ticking, each tick arms the next assignment interval. The edge transition stops the process, yielding the result of the most recent interval armed. This is one way of viewing the process. Pictorially, we have something like the following picture where the pulse is represented by the blue trace, which goes low during interval 2, in this example.

Guidelines for the Measuring Circuit (Receiver)

The measuring circuit should be arranged similarly to the generating circuit in that the result of a measurement should not influence the result of a subsequent measurement. This can only be achieved by using independent measuring circuits for each of the four intervals associated with a symbol.

A symbol is defined by its four edges. The length of a symbol is the time between three adjacent rising edges (with two falling edges in between). The third rising edge signifies the start of the next symbol as well as the end of the current symbol. The first rising edge seen by the receiver indicates the arrival of the first symbol and should be used to start four timers conceptually parallel to the generating circuit. The first circuit is stopped by the second edge (falling), the second circuit is stopped by the third edge (rising), the third circuit is stopped by the fourth edge (falling), and the next rising edge both stops the fourth timer and restarts the timer chain anew for the next symbol. To allow time for read-out, it might be necessary to alternate two different timing chains. If we let an edge both stop and start a single timer or an alternate pair of timers, we run the risk of increasing the measurement error by making the starting position of one symbol segment dependent on the jitter in a previous segment. This will produce additive errors within a symbol, making the error in the fourth interval twice that of the first interval. If a timer chain, as described here, is used, the uncertainty will be that of the start of a symbol; this type of error is included in the above calculations.

Symbol Identification [Receiver Discussion]

Introduction

In determining the error from the individual intervals, the geometrical nature of higher dimensions is ignored. In 2 dimensions, the above interval-error determination accounts for the area of the circle around the symbol position but neglects the additional and valid area of the square surrounding the circle. Allowing the decision area or volume to extend into this square adds 27%. In 3D, the valid volume nearly doubles (91%), and in 4D the volume of the hypercube is 3.24 times the volume of the enclosed hypersphere. It would seem that there is much more signal to be extracted from the noise than the interval assignment method achieves.

The task is to design a receiver circuit that takes advantage of this extra decision volume (and does so with efficiency and speed). Conceptually, this is done by measuring the individual intervals and then computing the distance from the likely centers. In 2D, there are 6 candidates, in 3D there are 12, and in 4D there are 24 such nearest neighbors touching any particular center. Note that if the interval assignment is correct, the equivalent circle or sphere has been identified. The corner areas have still been left out. To include the corner areas, a measurement resolution much smaller than the interval resolution must be used. Then the closest center wins.

Given a CapSigma-jitter and in interval spacing comparable to this jitter (instead of 5 to 10 times the jitter as above), the measuring circuit assigns n numbers to an n-dimensional symbol. Given these n numbers, which can now each have errors of up to 50% in the assignment of the particular integers, what type of decision circuit is most effective at assigning signals? Are the resulting error rates substantially better? For what set of interval-to-jitter parameters? We will obviously require a much finer division of intervals than that used in the transmitter to generate the symbols.

It is only worth doing the analysis if we come up with a fast and effective receiver circuit. A guess as to the benefits to be gained from comparing the volumes (above) is that there is another 5 dB of signal to recover from the noise if the receiver can be made sufficiently sophisticated. This could be well worth the effort for certain applications.

Divide Intervals into m Subintervals

If each possible generated interval is split into m subintervals, an interval measurement for a width of n units will yield an integer value of exactly m×n if there is no noise. Suppose that there is noise Here, the red distributions represent the sub-interval errors and the blue distribution is at the edge location. The sub intervals are now close enough that there is significant overlap from intervals farther than the nearest ones. For example, the obvious possibilities are from A2, A3, A4, and A5 in this case where sub-interval spacing is 2×CapSigma. The various distributions are shown at their expected positions; in this case, the time of the pulse transition would be most probably assigned to sub interval 3, but could be assigned to 2 or 4 with appreciable probability and to sub interval 1 or 5 with lesser probability. These probabilities are computed in the manner used above, but this is not material to the present discussion.

The measurement circuit is designed to produce integers that represent the subinterval selected. These subintervals completely tile each of the main intervals so that if a subinterval within a given main interval is identified, then the corresponding main interval is necessarily chosen. Thus, for a 2D rectangular lattice, there is no difference between the interval approach and one based on subintervals. However on 3D and 4D lattices where the centers are fcc, this is not necessarily the case since a subinterval measurement could well choose a site with the incorrect parity.

Logic States of the Four-Dimensional Signal

Referring to FIG. 1, showing a four-dimensional signal based on pulse-width modulation of both polarities or amplitude states of an output voltage, 101 shows the start time of the signal when the output goes high. 102 indicates the time when the first part of the symbol is finished and the start of the second part with the output going low. Duration 106 indicates the time span of the first part, or dimension 1 of the output. 103 indicates the time when the output goes high again specifying the end of the second part and start of the third part of the symbol. Duration 107 represents the time span of the second part, or dimension 2. Continuing in this manner, 104 shows the end of third part and the start of the fourth part. Duration 108 represents the time span of the third part of the signal representing the symbol; this is the third dimension. 105 represents the end of the fourth part and of the signal representing the four-dimensional symbol. Duration 109 represents the time span of the fourth part or dimension. Duration 110 shows the entire duration of the signal encoding the four-dimensional symbol.

Continuing with the example of a four-dimensional symbol, the preferred embodiment of the invention, the start of the next symbol occurs at the end of the preceding symbol, namely the point 105 in FIG. 1.

It will be recognized that adding (removing) one such part increases (decreases) the dimensionality of the symbol by one. For example, FIG. 1 can equally well represent two conjoined two-dimensional signals, a single four-dimensional signal, or half of an 8-dimensional symbol, among other obvious combinations. It is possible to create odd-dimensional symbols, but they would have an undesirable property of alternate transitions directions at starting and stopping points.

Information Encoding in a Four-Dimensional Symbol

The timing circuitry to be discussed below necessarily has finite resolution. That is, the physics of the devices used limit the precision of temporal division to a certain time interval below which it is impossible to distinguish different, closely space time intervals. This limit is due to the bandwidth that the wires, cable, or circuit traces impose as well as by the inherent jitter in the component devices comprising the various circuits.

Suppose that this limit is represented by the letter $\mu$ (for "measures" expressed in some time units). Then a pulse (either high or low) with length k $\mu$, where k is an integer greater than 1, can be reliably distinguished from one that is (k+1) $\mu$ or (k−1) $\mu$, in duration, but not from a pulse whose width lies between k $\mu$ and (k±1) $\mu$.

Let the resolution of the signal-generation circuit be 5; that is $0 \le k \le 4$ so that there are five distinguishable width states to each part of a symbol. Suppose further that we choose a symbol constellation based on a face-centered cubic (fcc) grid. A symbol has the tuple representation as above of {i, j, k, l} with each integer index ranging from 0 to 4. The fcc constraint demands (for purposes of higher noise immunity) that the sum i+j+k+l is an even number. Under these conditions, there will be 313 distinct symbols in the constellation. Reserve 256 of these symbols for a mapping between the 256 8-bit binary integers, leaving 57 possible symbols either unused or reserved for control symbols such as an idle symbol representing no information being transmitted, among other possibilities.

As shown in Ref 2, there are approximately twice as many symbols in a rectangular lattice, where each lattice point has an assigned symbol, than in the fcc case where the odd lattice points are intentionally left unassigned. Thus, the bit rate for the rectangular case is one more that for the fcc case, but the fcc case has higher noise immunity at the cost of this one bit.

Symbol Generating Method for a Four-Dimensional Signal

Figure 2:
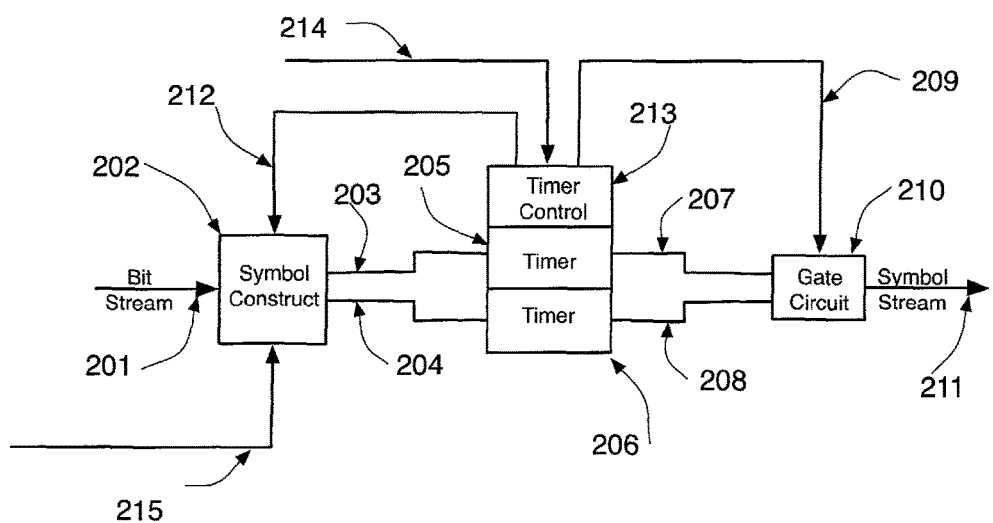
FIG. 2 is a block diagram of a symbol encoder, representing an embodiment of the invention.

Referring to FIG. 2 showing a block diagram of a mechanism for generating a four-dimensional signal, 201 indicates the input bit stream, which may be either serial or parallel. This bit stream may originate in any number of physical devices such as computer memory or first-in-first-out (FIFO) buffer and is represented physically by a sequence of logic levels (high-low voltages) standing for digital data and encoded as the usual ones and zeros. Bit stream 201 enters symbol constructor 202 where it is parsed and encoded into four parts, each part representing a dimension of the logical symbol being assembled.

Symbol constructor 202 is a hardware realization of a mapping between a predetermined grouping of bits in the input stream to four integers representing the symbol. In the example above, each 8-bit group parsed from the input stream is mapped to a symbol specified by a 4-tuple of integers each between 0 and 4. Symbol constructor 202 produces a single four-part symbol from each grouping of 8 bits and partitions these four numbers into two groups. The first group, consisting of the integers i and i+j is presented via connections 203 and 204 to parallel timing circuits 205 and 206, respectively. The second group, consisting of the integers i+j+k and i+j+k+l, is held for conversion of the second half of the symbol. Symbol constructor 202 contains the necessary output buffers to keep the output of the symbol generator of FIG. 2 busy at all times. If there are no data on input 201, the symbol constructor prepares a stream of idle symbols for conversion by the timing circuits.

Symbol constructor 202 presents coded symbol integers on an as-needed bases to symbol timers 205 and 206. When a coded symbol part is removed from the input buffer of timer 205 or timer 206, timer control 213 requests symbol constructor 202 for another symbol part via control line 212. In this way, the presentation of coded symbol parts and conversion to pulse width is synchronized on an as-need basis so that the symbol stream at output 211 is not interrupted.

When the symbol has been encoded by 202 and the first half transmitted to the timing stages 205 and 206, the conversion in these timing stages is initiated whereupon a start signal on control line 209 sets the output of gate circuit 210 to high. This action is simultaneous with the outputs 207 and 208 of timer stages 205 and 206 going high. That is, upon a "ready" signal generated in timer control 213, the output 211 of the symbol generator of FIG. 2 goes high as do lines 207 and 208, which are inputs to gate circuit 210.

Output 207 of the first timing circuit 205 stays high for a period of $\tau_1 = \Delta + \mu$ i units of time, where $\Delta$ is a bandwidth-dependent constant. At the end of this period, output 207 switches state to low. Similarly for the second timing circuit 206; output 208 stays high for a period of $\tau_2 = 2\Delta + \mu(i+j)$ units of time. At the end of this second period, output 208 switches state to low.

Gate circuit 210, which previously switched its output state on output line 211 from low to high upon the "start" control supplied by line 209 (simultaneously with lines 207 and 208 going high), effects a change in state on the output line 211 each time one of its input lines, 207 or 208 changes state. When output 208 changes state, the timer control 213 starts pulse width conversion for the next half of the symbol. This second half, noted above by i+j+k and i+j+k+l, is ready for conversion as it had already presented by symbol constructor 202 on lines 203 and 204 to timer stages 205 and 206. However, during this second half of the signal, the first timing circuit 205 now stays high for a period $\tau_3 = 3\Delta + \mu(i+j+k)$ units of time and timing circuit 206 stays high for a period $\tau_4 = 4\Delta + \mu(i+j+k+l)$ units of time. This second half of the symbol is controlled as described for the first half, the only difference being the a 3 $\Delta$ and 4 $\Delta$ added to the integers presented by symbol constructor 202.

As the final part of the completed symbol is determined by line 208 going low for the second time, a new symbol is ready for conversion and the process repeats.

In this manner, gate circuit 210 presents a continuous stream of encoded pulses as a symbol stream on output 211 This symbol stream is a continuous sequence of two-state pulses, where each state has a discretely variable width. This stream may be appropriately amplified and used to modulate a laser (light source) or any other useful carrier of information.

By following the logic of the above-described circuits, it is may be recognized that a wave form of the kind represented in FIG. 1 may be generated. It is also evident that this waveform may be indefinitely repeated according to data presented to the circuit on bit stream 201, effecting a continuous conversion of binary digital data to an encoded form pulses representing a sequence of multidimensional symbols. An alternate embodiment is to use four timing circuits instead of two. In this version, symbol constructor 202 sends all four parts to four timer stages instead of two. Simply view timers 205 and 206 as dual independent timers each with two inputs and two outputs. The preferred embodiment of two timers is a simpler circuit and is just as effective at symbol conversion as the four-stage version. There is no innovative step in changing from four timers to two timers as equivalence between the two versions is readily apparent to anyone familiar with common practices of circuit design.

Parameter line 214 allows the number of dimensions to be set, essentially determining how many n Δ times are added to each timer state 205 and 206 before resetting at the start of a new symbol. Other information provided on parameter line 214 concerns the delay step sizes Δ and μ as well as controlling the operation of the symbol generator, allowing it to be stopped completely or restarted as needed.

From this discussion, it is evident that symbols of any (even) dimensions of 2 or above can be constructed and assembled in this manner.

Parameter line 215 loads symbol constructor 202 with information concerning the number of states and the dimensions of the symbols to be mapped. Alternatively, a complete symbol table map can be downloaded into symbol constructor 202 via line 215. That is, the symbol table may be either mapped or computed by the constructor 202, depending on the particular design.

Each of the timer circuits 205 and 206 are based on the invention of Ref 4 where a method of controlling pulse widths based on digital information is disclosed.

Detecting Signals and Decoding Symbols

The symbol stream generated by the circuit of FIG. 2 may be used to modulate an appropriate carrier. In this way, information may be transmitted to another location or device. At the receiving device, assume that means to demodulate the carrier are employed. The demodulated signal, in the form of a stream of pulses, is passed to a decoding circuit that measures the durations between each voltage-state transition thereby decoding the pulses into a stream of symbols and thence to a stream of bits representing the original data.

For example, the bit stream might be a digital message sent over a light beam from one part of a communication system to another. The light is pulse-encoded as a sequence of high-intensity light follow by low-intensity light states, each state has a prescribed duration. At the receiving end, one typically employs a photodiode that puts out a high-voltage state in response to the high-intensity part, followed by a low-voltage state in response to the low-intensity part.

The bandwidth of both the transmitting side and the receiving side determine the minimum pulse width Δ as noted above.

The symbol-detection circuit is based on the invention of Ref 3, which discloses a high-speed converter for converting a pulse width to a binary integer. The detection circuit required to provide the required conversion must have at least a resolution of the value used to generate the transmitted signals. Let δ be the resolution of the detection circuit. Preferably δ will be some fraction of μ such as one half or one third. This will enable the detection circuit to assign a value within an error of ±μ instead of ±μ, allowing a conversion process with higher accuracy.

Figure 3:
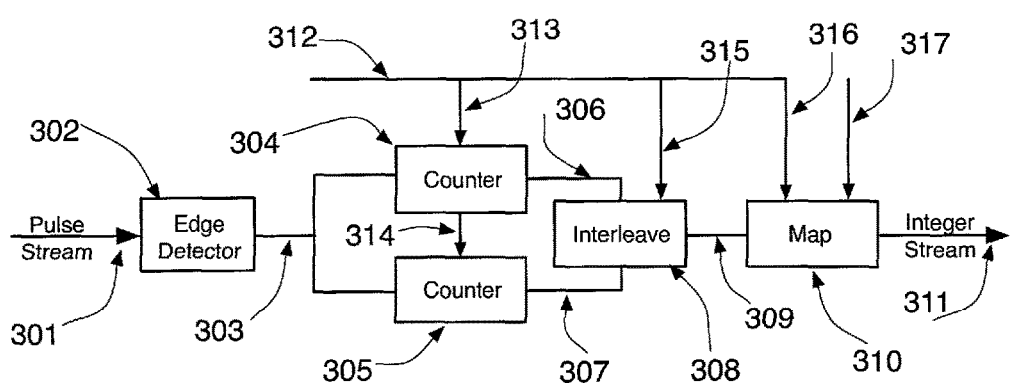
FIG. 3 is a block diagram of a symbol detector, representing an embodiment of the invention.

Referring to FIG. 3, pulse stream, 301 consisting of a sequence of rising and falling edges of a voltage level, is applied to the edge detector 302, which generates a precise timing signal (a narrow pulse) each time the input stream changes state (high-to-low, or low-to-high). This timing pulse is applied to each of two counters 304 and 305 via input line 303. Upon initialization, via line 312, counter 304 is gated off via line 313 and counter 305 is gated on via line 314 (logic gates, not shown, are included in each of the circuits responding to the initialization signal). Thus, counter 304 is stopped and counter 305 is running. The first pulse generated by the edge detector 302 causes the counters to reverse state. That, counter 304 is started and counter 305 is stopped. The next pulse generated by edge detector 302 reverses the state of the counters once more, so that counter 304 is stopped and counter 305 is started. This state-reversal process continues as each timing pulse is generated by edge detector 302.

When counter 304 is stopped, its count in the form of a coded integer, typically small between 2 and 8 bits, is presented to interleave circuit 308 via line 306, and the counter 304 is reset to await its next start signal. Similarly, when counter 305 is stopped, its count in the form of a coded integer, typically small between 2 and 8 bits, is presented to interleave circuit 308 via line 307, and the counter 305 is reset to await its next start signal. In this way, an alternating sequence of coded integers is presented to interleaver 308 which assembles them in the correct order in its symbol buffer (not shown). Initialization signal via line 315 has previously cleared the symbol buffer in interleaver 308 and ensured that the first integer from counter 305 via line 307 is ignored. Thus, the first integer stored into the symbol buffer in interleaver 308 represents the time interval of the first pulse in the pulse stream measured following the initialization signal on line 312.

To ensure that the symbol decoder of FIG. 3 has started on the correct phase or state of the symbol presented, common practice known to designers in the field of pulse-controlled timing circuitry is to transmit a null signal at the beginning of each communication. The system then synchronizes its activities based on known and prespecified properties of a null sequence. Since this is well understood in the art, details of such synchronization circuitry are not discussed and will be assumed to follow common practice.

At the completion of each symbol residing in the symbol buffer in interleaver 308, the buffer contents are passed to the mapping circuitry, map 310. Map circuit 310 has been previously set to an initial state via the initialization signal on line 316. Prior to initialization, a map particular to the symbol type being decoded has been loaded into map circuit 310 via line 317. Thus, the map circuit 310 is ready to receive groups of symbol integers as described above. For the four-dimensional case of the preferred embodiment, the received symbol is in the form of a 4-tuple of small integers.

The function of the map circuit 310 is to use those four numbers as indices into a look-up table, namely the map that had been previously loaded via line 317. The function of the map look-up is to convert or map the 4-tuple of small integers into a single integer representing the index or name of the converted symbol. In the preferred embodiment of a symbol constellation having 256 or more symbols, this is a binary integer in the range of 0 to 255. This binary number is sent to the output where it becomes part of the integer stream on line 311.

An alternate method to remap the 4-tuple representing the symbol is to perform some simple arithmetic on the four integers. A simple calculation then converts the 4-tuple of integers into a binary integer by a series of shifts (doublings) and concatenation of the four pieces.

An alternate embodiment of the circuit in FIG. 3 is to use four counter circuits instead of two. In the four-counter version, each counter sends its integer to the map circuit 310 and the symbol is then complete after the fourth counter has transferred its information. The preferred embodiment of two counters is a simpler circuit and is just as effective at symbol decoding as the four-counter version. There is no innovative step in changing from four counters to two counters as equivalence between the two versions is readily apparent to anyone familiar with common practices of circuit design.

CONCLUSION

The described embodiments and examples are illustrative only and not intended to be limiting. Although embodiments of the invention can be implemented separately, embodiments of the invention may be integrated into the system(s) with which they are associated. All the embodiments of the invention disclosed herein can be made and used without undue experimentation in light of the disclosure. Although the best mode of the invention contemplated by the inventor(s) is disclosed, embodiments of the invention are not limited thereto. Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences. The individual components of embodiments of the invention need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein. Agents which are both chemically and physiologically related may be substituted for the agents described herein where the same or similar results would be achieved.

Various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. An apparatus, comprising
a transmitter; and
a multidimensional symbol encoder coupled to the transmitter, the multidimensional symbol encoder including a gate circuit that presents a continuous stream of encoded pulses as a symbol stream on an output,
wherein the multidimensional symbol encoder encodes multidimensional symbols by concatenating two or more partial symbols, wherein individual intervals of up and down sections of the two or more partial symbols are i) independently controlled as to duration and ii) up and down section of two or more concatenated partial symbols.

2. An apparatus, comprising
a receiver; and
a multidimensional symbol decoder coupled to the receiver, the multidimensional symbol decoder including an edge detector which generates a precise timing signal (a narrow pulse) each time an input stream changes state (high-to-low, or low-to-high),
wherein the multidimensional symbol decoder decodes multidimensional symbols by measuring duration of individual intervals i) that are independently controlled as to duration and ii) that are up and down sections of two or more concatenated partial symbols.

* * * * *

UNITED STATES PATENT AND TRADEMARK OFFICE
CERTIFICATE OF CORRECTION

PATENT NO. : 10,153,925 B2
APPLICATION NO. : 14/499167
DATED : December 11, 2018
INVENTOR(S) : William B. Dress Page 1 of 1

It is certified that error appears in the above-identified patent and that said Letters Patent is hereby corrected as shown below:

In the Claims

Column 12, Line 37 change "section" to --sections--.

Signed and Sealed this
Twenty-ninth Day of January, 2019

Andrei Iancu
*Director of the United States Patent and Trademark Office*